US008178906B2

(12) United States Patent
Hooper et al.

(10) Patent No.: US 8,178,906 B2
(45) Date of Patent: May 15, 2012

(54) LASER CHALCOGENIDE PHASE CHANGE DEVICE

(75) Inventors: Andy E. Hooper, Beaverton, OR (US); Allen Kawasaki, Hillsboro, OR (US); Robert Hainsey, Portland, OR (US)

(73) Assignee: Electro Scientific Industries, Inc., Portland, OR (US)

(*) Notice: Subject to any disclaimer, the term of this patent is extended or adjusted under 35 U.S.C. 154(b) by 0 days.

(21) Appl. No.: 11/972,660

(22) Filed: Jan. 11, 2008

(65) Prior Publication Data

US 2009/0179201 A1 Jul. 16, 2009

(51) Int. Cl.
*H01L 29/04* (2006.01)

(52) U.S. Cl. ........... 257/209; 257/529; 257/530; 257/50

(58) Field of Classification Search .................... 257/50, 257/209, 529, 530

See application file for complete search history.

(56) References Cited

U.S. PATENT DOCUMENTS

| | | | |
|---|---|---|---|
| 3,983,076 A | 9/1976 | Rockstad et al. | |
| 4,545,111 A | 10/1985 | Johnson | |
| 4,630,355 A | 12/1986 | Johnson | |
| 4,666,252 A | 5/1987 | Yaniv et al. | |
| 5,585,602 A | 12/1996 | Bernstein | |
| 5,920,789 A | 7/1999 | Bernstein | |
| 6,057,221 A | 5/2000 | Bernstein et al. | |
| 6,258,633 B1 | 7/2001 | Lee et al. | |
| 6,448,576 B1 | 9/2002 | Davis et al. | |
| 6,692,994 B2 | 2/2004 | Davis et al. | |
| 6,778,420 B2 | 8/2004 | Parkinson | |
| 6,867,425 B2 * | 3/2005 | Wicker | 257/3 |
| 6,969,869 B2 * | 11/2005 | Hudgens et al. | 257/50 |
| 7,561,463 B2 * | 7/2009 | Lung et al. | 365/163 |
| 2003/0045034 A1 | 3/2003 | Davis et al. | |
| 2004/0157159 A1 * | 8/2004 | Zhou et al. | 430/270.13 |
| 2005/0199420 A1 * | 9/2005 | Ishimaru et al. | 174/250 |
| 2006/0097240 A1 | 5/2006 | Lowrey et al. | |
| 2006/0113520 A1 | 6/2006 | Yamamoto et al. | |

FOREIGN PATENT DOCUMENTS

| | | |
|---|---|---|
| JP | 2004-103604 | 4/2004 |
| KR | 2006-0061232 A | 6/2006 |

* cited by examiner

*Primary Examiner* — Wai Sing Louie
*Assistant Examiner* — Bilkis Jahan
(74) *Attorney, Agent, or Firm* — Young Basile

(57) ABSTRACT

A laser activated phase change device for use in an integrated circuit comprises a chalcogenide fuse configured to connect a first patterned metal line and a second patterned metal line and positioned between an inter layer dielectric and an over fuse dielectric. The fuse interconnects active semiconductor elements manufactured on a substrate. A method for activating the laser activated phase change device includes selecting a laser condition of a laser based on characteristics of the fuse and programming a phase-change of the fuse with the laser by direct photon absorption until a threshold transition temperature is met.

11 Claims, 6 Drawing Sheets

14'
14'
10'
B
20
24
20
20
16'
A
16'

FIG. 3A
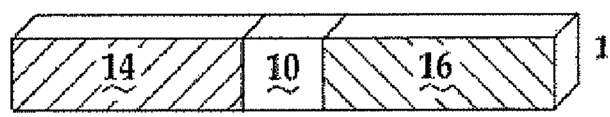
FIG. 3B
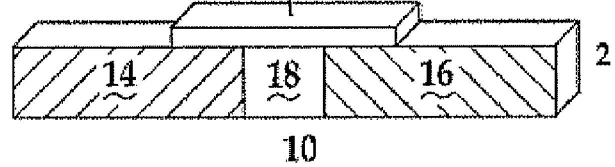
FIG. 3C
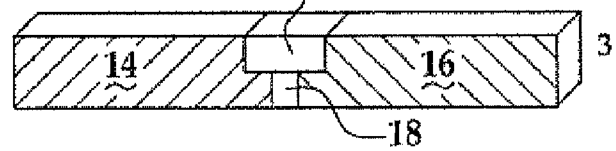
FIG. 3D
14 10 16 4
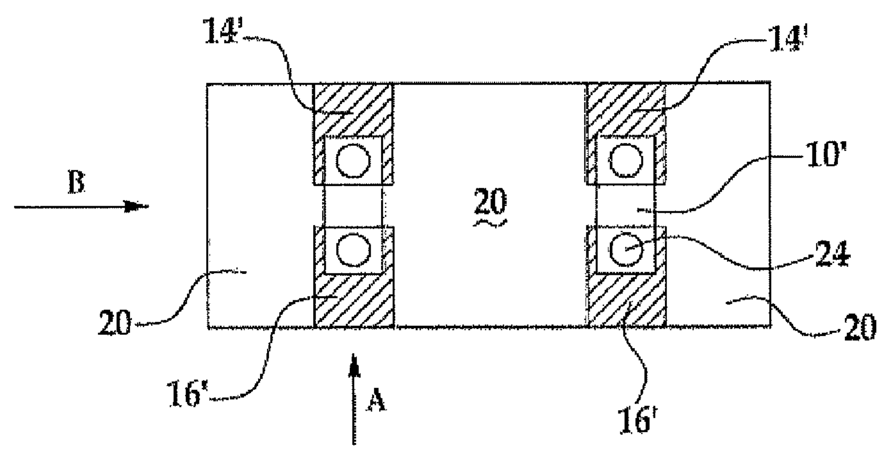
FIG. 4
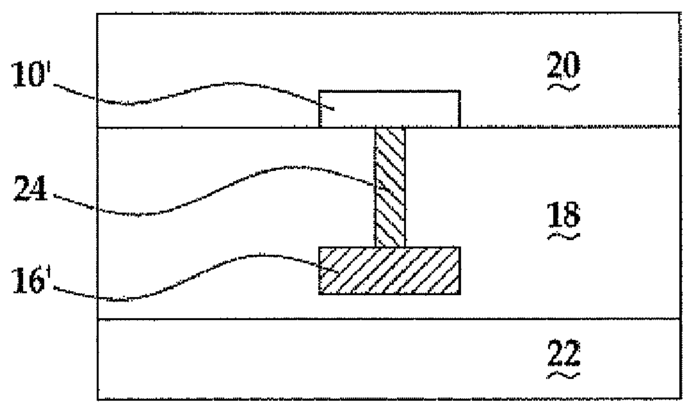
FIG. 5

LASER CHALCOGENIDE PHASE CHANGE DEVICE

FIELD OF THE INVENTION

This invention relates generally to a chalcogenide phase change device for use in a semiconductor and a method of activating the device using a laser.

DESCRIPTION OF THE RELATED ART

The use of lasers to cut fuses on semiconductors is known in the art. Currently, laser fuses are made from metals such as Al, Cu, and W. These fuses are blown by shooting them with a single pulse of laser energy in order to melt, vaporize or ablate the fuse material. These fuses are blown with a laser to physically remove the fuse material, thereby creating an open electrical circuit. By blowing a specific pattern of fuses, for example, faulty memory cells can be replaced with extra redundant functional memory cells that are designed into each chip. The fuses may also be used for other purposes, such as fine tuning or trimming a semiconductor device, including programming and identification.

SUMMARY OF THE INVENTION

Disclosed herein are embodiments of a laser chalcogenide phase change device, a method of activation and a method of manufacture.

One embodiment of the invention is a laser activated phase change device for use in an integrated circuit. According to one example of such a device, the device comprises a chalcogenide fuse configured to connect a first patterned metal line and a second patterned metal line in a metal deposition layer and positioned between an inter layer dielectric and an over fuse dielectric. The fuse interconnects active semiconductor elements manufactured on a substrate. The fuse may be linearly aligned with the patterned metal lines, or the fuse may be layered on the first and second patterned metal lines to span a gap between the first and second metal lines and overlap the first and second metal lines. Another embodiment configures the chalcogenide device as a fuse with an island configuration. Adhesive layers may be used between the chalcogenide phase change material and the metal depositions.

Another embodiment of the laser activated phase change device for use in a semiconductor has a chalcogenide structure, at least two patterned metal depositions within a first metal deposition layer formed on the chalcogenide structure, and at least one conductive or reflective line drawn by a laser between the patterned depositions and on the chalcogenide structure. This embodiment may further comprise at least one more metal deposition layer containing the patterned metal depositions.

A method of activating the laser chalcogenide phase change device disclosed herein comprises, for example, selecting a laser condition of a laser based on one or more characteristics of the fuse and programming a phase-change of the fuse with the laser by direct photon absorption until a threshold transition temperature is met. The phase-change of the fuse may be from an amorphous state to a reversible crystalline state or from a crystalline state to a reversible amorphous state. Another method disclosed programs the phase-change of the fuse by surpassing the threshold transition temperature, thereby phase-changing the fuse from a crystalline state to a permanent amorphous state.

Another embodiment of a method of activating a phase change device for use in a semiconductor comprises identifying a phase change device requiring activation, wherein the phase change device is a chalcogenide fuse connecting a first patterned metal line and a second patterned metal line and positioned between an inter layer dielectric and an over fuse dielectric. The fuse interconnects active semiconductor elements manufactured on a substrate. The method further includes selecting a laser condition of a laser based on properties of the phase change device and programming a phase-change of the phase change device with the laser by direct photon absorption until the phase-change occurs.

BRIEF DESCRIPTION OF THE DRAWINGS

The description herein makes reference to the accompanying drawings wherein like reference numerals refer to like parts throughout the several views, and wherein:

FIGS. 3A-3D are three dimensional cross-sectional views of the embodiments of the laser programmable chalcogenide phase change device corresponding to FIGS. 2A-2D;

FIG. 4 is a plan view of a second embodiment of the laser programmable chalcogenide phase change device incorporated into a traditional "island" laser fuse bank;

FIG. 5 is a cross-sectional view of the second laser programmable chalcogenide phase change embodiment of FIG. 4 along the dotted line and viewed from direction A;

DETAILED DESCRIPTION

The inventors have noted a number of problems with the current use of metal laser fuses. The traditional process of physically removing the conductive fuse material with a laser subjects the fuse and the surrounding materials and structures to thermal and mechanical stress. This stress can be great enough to damage the surrounding materials or structures, resulting in defects that render the chip unusable. That is, traditional fuses are predominantly metal alloys or a sandwich of metals. These fuses must be placed far enough apart so that the energy applied to one fuse will not also hit an adjacent fuse. Because metals are highly conductive and have relatively large coefficients of thermal expansion, even a small amount of heating will damage a metal laser fuse by expansion and cracking of the surrounding dielectric. Hence, the layout of laser fuses is limited by the smallest available laser spot diameter. If metal laser fuses are placed close enough so that any of the laser spot size strikes the adjacent fuse, the adjacent fuse will be damaged.

Another drawback is that no further use can be made of a blown fuse due to the destruction of the material. The destruction of the material also prevents the placement of laser fuses over lower layer buses or other interconnects, because during processing some amount of laser energy is transmitted into the regions under the fuse that has the potential to damage any device below it. This further limits the size reduction of the semiconductor.

According to teachings herein, a laser fuse device can be processed non-destructively so that space on a semiconductor substrate or wafer can be used as efficiently as possible. Chips can be scaled ever-smaller by configuring fuses closer together. Allowing placement of laser fuse devices over both active and inactive elements of circuitry reduces the required space. Real-time process feedback of fuse states is also possible according to the teachings herein.

Embodiments of the laser programmable chalcogenide phase change device and methods of use are taught herein with reference to the accompanying drawings.

Figure 1:
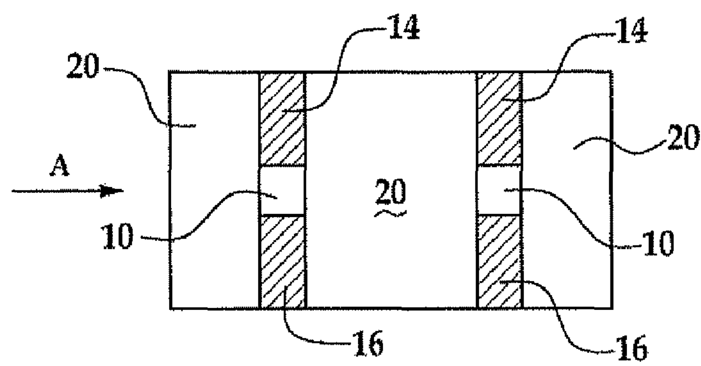
FIG. 1 is a plan view of an embodiment of the laser programmable chalcogenide phase change device incorporated into a traditional laser fuse bank.
Figure 12:
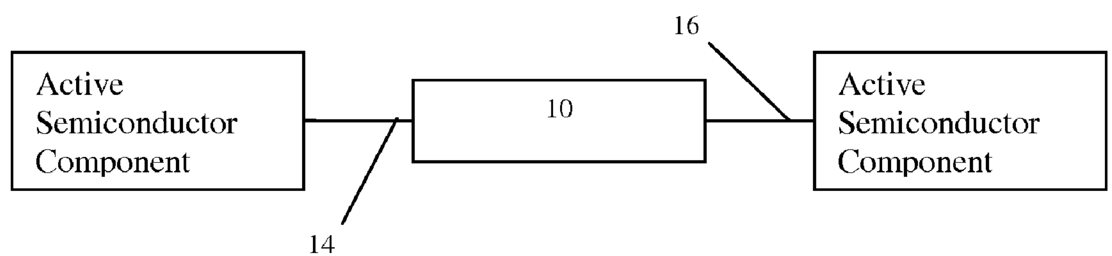
FIG. 12 is a schematic diagram of a phase change device according to an embodiment of the invention interconnecting active semiconductor elements manufactured on the substrate.

A first embodiment of the laser programmable chalcogenide phase change device is illustrated in FIGS. 1-3. FIG. 1 is a top or plan view of the laser programmable chalcogenide phase change device 10 in a typical fuse bank utilized in semiconductor construction where the phase change device is in a linear placement. The phase change devices 10 are placed between patterned metal lines 14, 16 within a single metal deposition layer and positioned between an inter layer dielectric 18 and an over fuse or outer layer dielectric 20. The phase change device 10 is positioned to interconnect active semiconductor elements manufactured on a substrate 22 as shown schematically in FIG. 12. There is at least one phase change device 10 in each fuse bank, here shown in parallel.

FIGS. 2A-2D are cross-sectional views of the phase change device 10 within a typical fuse bank across the dotted line and from the direction of arrow A, as shown in FIG. 1. As seen in FIGS. 2A-2D, the phase change device 10 is located between an inter layer dielectric 18 and an outer layer dielectric 20. These layers are formed on a substrate 22, such as a silicon wafer, during the back end of line process of semiconductor manufacturing.

As used herein, the general front end process in semiconductor manufacturing, for example, encompasses wafer production, wafer fabrication, thermal oxidation or deposition, masking, etching and doping. These steps may be repeated several times. The front end process produces the active device. As used herein, the general back end of the line process involves dielectric deposition and metallization, passivation, electrical testing and assembly into single chips and/or packages of chips.

Figure 2A:
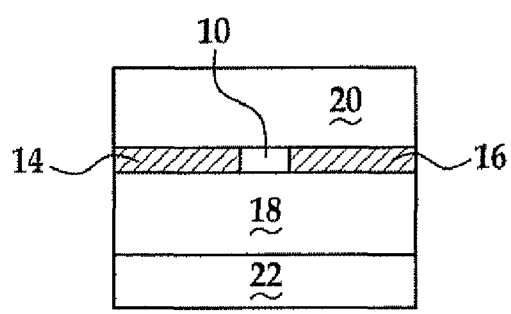
FIGS. 2A-2D are cross-sectional views of embodiments of the laser programmable chalcogenide phase change device of FIG. 1A along the dotted line viewed from direction A.

As depicted in FIG. 2A, the laser programmable chalcogenide phase change device 10 is positioned linearly between first and second patterned metal lines 14, 16. The phase change device 10 fills the gap between the first and second patterned metal lines 14, 16. Overlying the metal lines 14, 16 and the phase change device 10 is the outer layer dielectric 20. Underlying the metal lines 14, 16 and the phase change device 10 is the inter layer dielectric 18. These back end layers are manufactured upon the substrate 22. As shown in FIG. 2A, the phase change device 10 is located entirely between the first and second metal lines 14, 16, with the same height and width of the metal lines 14, 16. However, it is not necessary that the phase change device 10 have an equal width and height. Alternative embodiments are depicted in FIGS. 2B-2D.

Figure 2B:
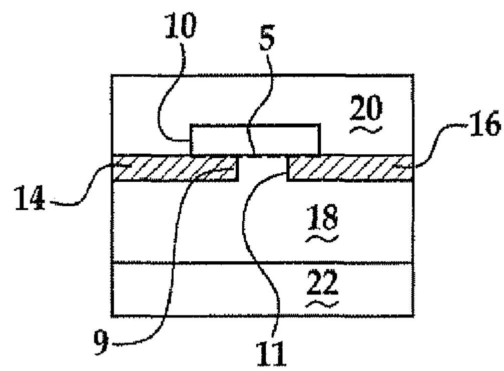

FIG. 2B is a variation on the placement of the phase change device 10. Rather than between the first and second metal lines 14, 16, the phase change device 10 rests on top of the ends 9, 11 of the patterned metal lines 14, 16, overlapping the ends 9, 11 and spanning the gap between the first and second metal lines 14, 16. An optional adhesive layer 5, shown here, may be used with any variation between the chalcogenide material of the phase change device 10 and the metal lines 14, 16. The inter layer dielectric 18, the outer layer dielectric 20 and the substrate 22 are depicted as described for FIG. 2A.

Figure 2C:
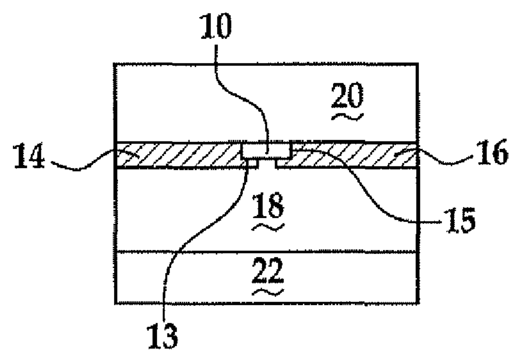

For the alternative embodiment illustrated in FIG. 2C, the first and second patterned metal lines 14, 16 abut the edges 13, 15 of the phase change device 10 and overlap the underside of the phase change device 10 partially, maintaining the gap between the metal lines 14, 16. Again, the optional adhesive layer 5, shown in FIG. 2B, may be used between the phase change device 10 and the first and second metal lines 14, 16. The inter layer dielectric 18, the outer layer dielectric 20 and the substrate 22 are depicted as described for FIG. 2A.

Figure 2D:
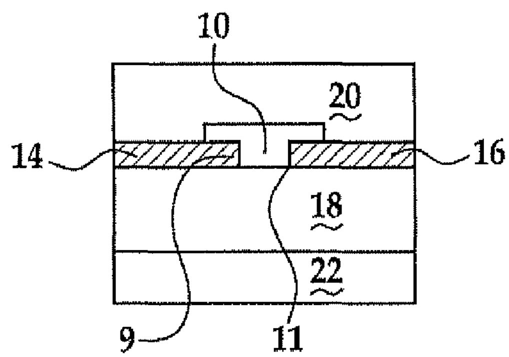

FIG. 2D is another alternative to the second embodiment of the phase change device 10. In this variation, the phase change device fills the gap between the first and second metal lines 14, 16 as well as overlaps the top of the ends 9, 11 of the metal lines 14, 16, spanning the gap between the first and second metal lines 14, 16. The optional adhesive layer, not shown, may be used between the chalcogenide material of the phase change device 10 and the metal lines 14, 16. The inter layer dielectric 18, the outer layer dielectric 20 and the substrate 22 are depicted as described for FIG. 2A. The variations described herein are non-limiting examples of one layer chalcogenide phase change devices.

FIGS. 3A-3D depict the variations of the laser programmable chalcogenide phase change embodiment of FIGS. 2A-2D respectively, omitting the inter layer dielectric 18, the outer layer dielectric 20, and the substrate 22 from the drawings for clarity.

FIGS. 4-7 illustrate a second embodiment of the laser chalcogenide phase change device taught herein. FIG. 4 is a top view of the laser programmable chalcogenide phase change device in a typical island fuse bank utilized in semiconductor construction.

Figure 6:
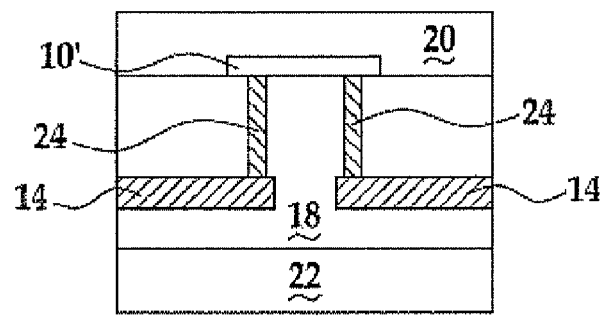
FIG. 6 is a cross-sectional view of the second laser programmable chalcogenide phase change embodiment of FIG. 4 along the dotted line and viewed from direction B.

FIG. 4 is a plan view of the phase change device 10' in an island fuse bank. The island phase change devices 10' are located in the outer layer dielectric 20 with the patterned metal lines 14', 16' below the phase change devices 10' in the inter layer dielectric 18. Each phase change device 10' is connected to the first and second metal lines 14', 16' by a metal via 24, shown in FIGS. 5 and 6. FIG. 5 is a cross-sectional view of FIG. 4 along the dotted line from the direction of arrow A, while FIG. 6 is a cross sectional view from the direction of arrow B. As shown, the metal vias 24 extend from the bottom ends of the phase change device 10' to each metal line 14', 16' through the inter layer dielectric 18. This configuration effectively connects the gap between the first and second metal lines 14', 16' with the vias 24 and the phase change device 10'. At least one phase change device 10' is utilized in each fuse bank with the fuse banks shown in parallel The inter layer dielectric 18 with the phase change device and the outer layer dielectric 20 are formed on a substrate 22, such as a silicon wafer, during the back end of line process of semiconductor manufacturing.

Figure 7:
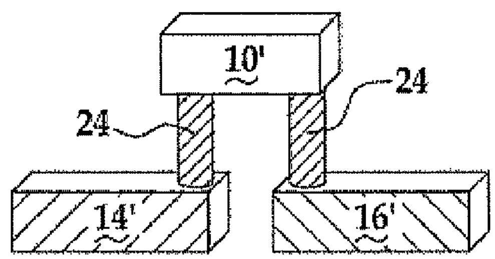
FIG. 7 is a three dimensional view of the second embodiment of the laser programmable chalcogenide phase change device.
Figure 8A:
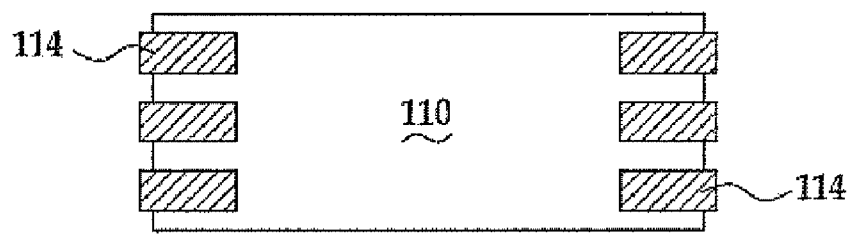
FIG. 8A is a plan view of a third embodiment of the laser programmable chalcogenide phase change device.
Figure 8B:
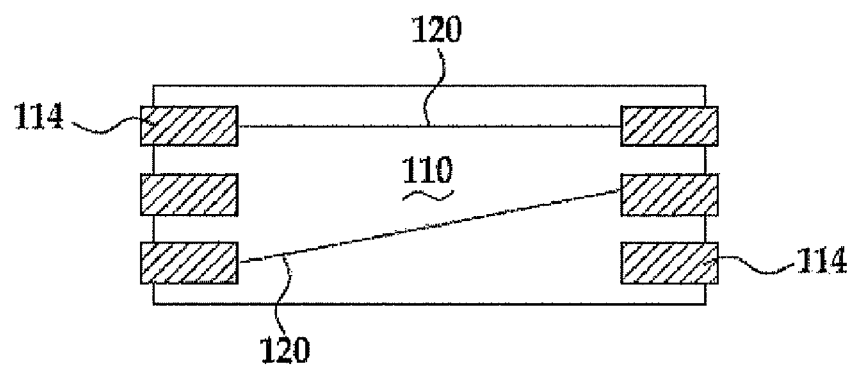
FIG. 8B is the plan view of FIG. 8A with conductive or reflective lines drawn in with a laser in the horizontal plane to connect metal lines within the same metal deposition layer.
Figure 9A:
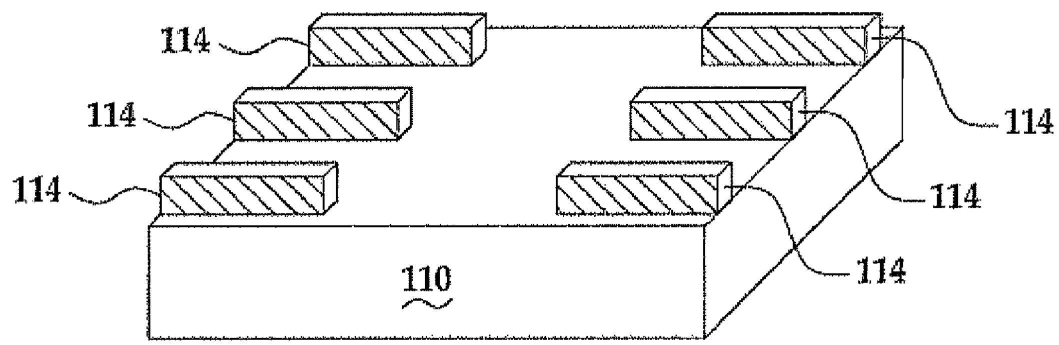
FIGS. 9A and 9B are three dimensional views of FIGS. 8A and 8B respectively.
Figure 9B:
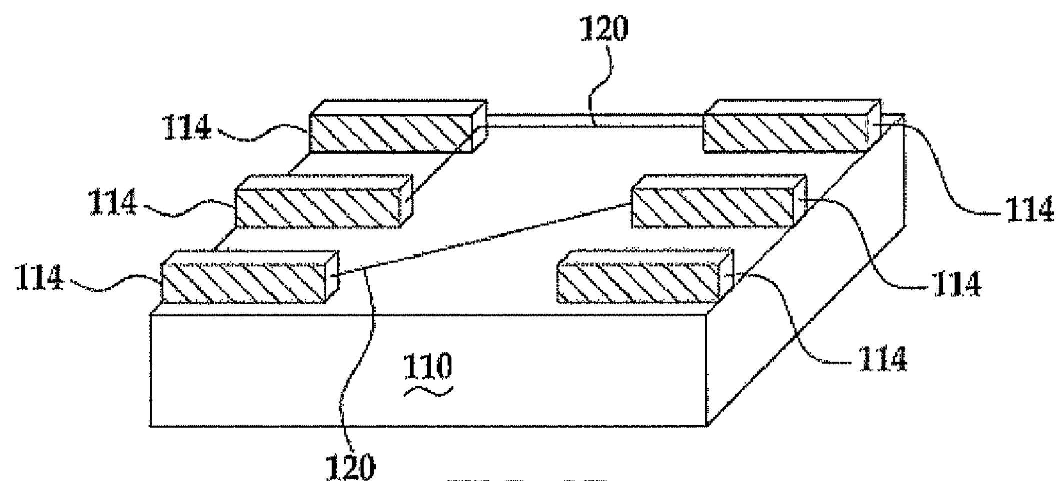

FIG. 7 illustrates the cross-sectional view of FIG. 6 in three dimensions for clarity. Contact points of the vias 24 on the phase change device or the metal lines are not limited to a particular area so long as a gap exists between the first and second metal lines, the gap being effectively closed by the phase change device.

The embodiments of the laser programmable chalcogenide phase change device described with reference to FIGS. 1-7 may be utilized, for example, to program a semiconductor device, form laser repair in redundancy applications such as for chip repair, for fuses and antifuses, for yield enhancement and for laser trim. Methods of use of the phase change device are described below.

FIGS. 8-11 illustrate a third embodiment of a chalcogenide phase change device. FIGS. 8A and 8B are plan views of a phase change device incorporated into a single metal deposition layer of the interconnect region of a semiconductor. The device could further include an overlying dielectric passivation layer (not shown). In FIG. 8A, a plurality of patterned metal depositions 114 are configured to contact a singular chalcogenide phase change device 110. In FIG. 8B, a laser is scanned over the device 110 to draw conductive or reflective lines 120 in any direction in the X-Y plane and connecting any two patterned metal depositions 114. FIG. 8B illustrates examples of such lines 120 drawn by the laser in the phase change device 110. For clarity, FIGS. 9A and 9B are three dimensional illustrations of FIGS. 8A and 8B respectively. In addition to drawing simple lines, conductive geometric patterns can be drawn or erased by the laser between any two metal depositions 114.

Figure 10:
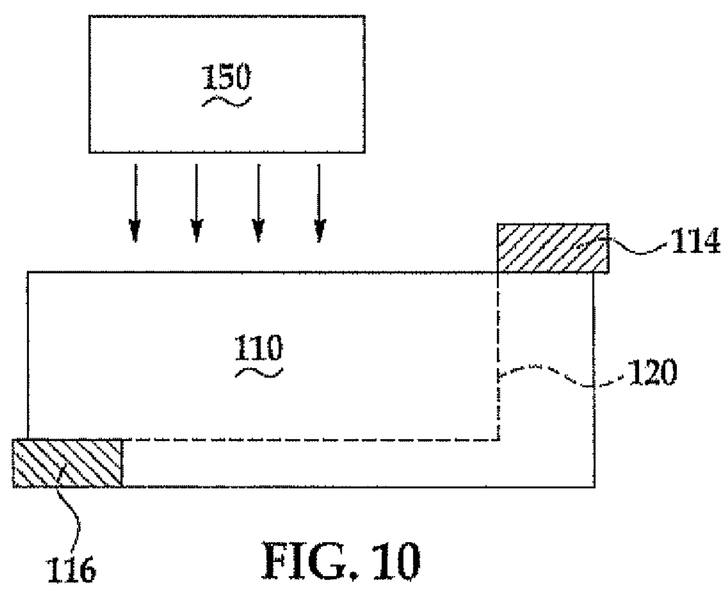
FIG. 10 is a side view of a fourth embodiment of the laser programmable chalcogenide phase change device in which conductive or reflective lines are drawn in with a laser in the horizontal and vertical planes to connect metal lines between two metal deposition layers.

This embodiment is not limited to two dimensional devices as shown in FIG. 7A. A variation of the third embodiment of the chalcogenide phase change device is shown in FIGS. 10-11. FIG. 10 is a cross-sectional view of a chalcogenide phase change device 110 incorporated into two metal deposition layers. As shown in FIG. 10, patterned metal deposition 114 is configured in one metal deposition layer, while patterned metal deposition 116 is configured in a second metal deposition layer. A laser 150 is used to draw vertical as well as horizontal conductive or reflective lines 120 within the chalcogenide phase change device 110. The laser 150 penetrates the phase change device 110 by focusing deep inside the material. These lines 120 can also be erased by the laser 150, being made non-conductive or non-reflective.

Figure 11A:
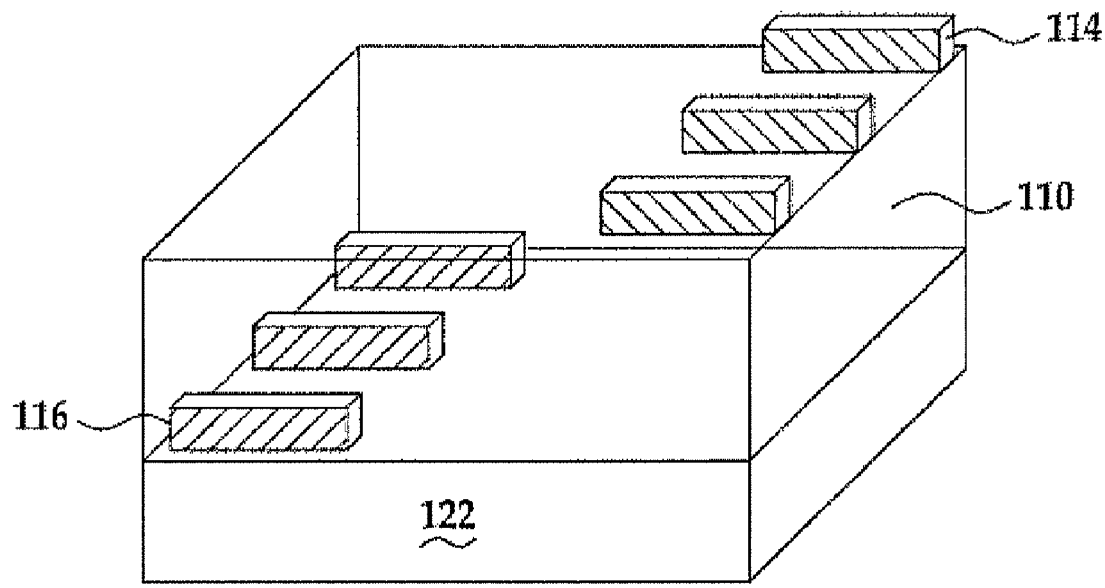
FIGS. 11A and 11B are three dimensional views of FIG. 10 without the conductive or reflective lines and with the conductive or reflective lines, respectively.
Figure 11B:
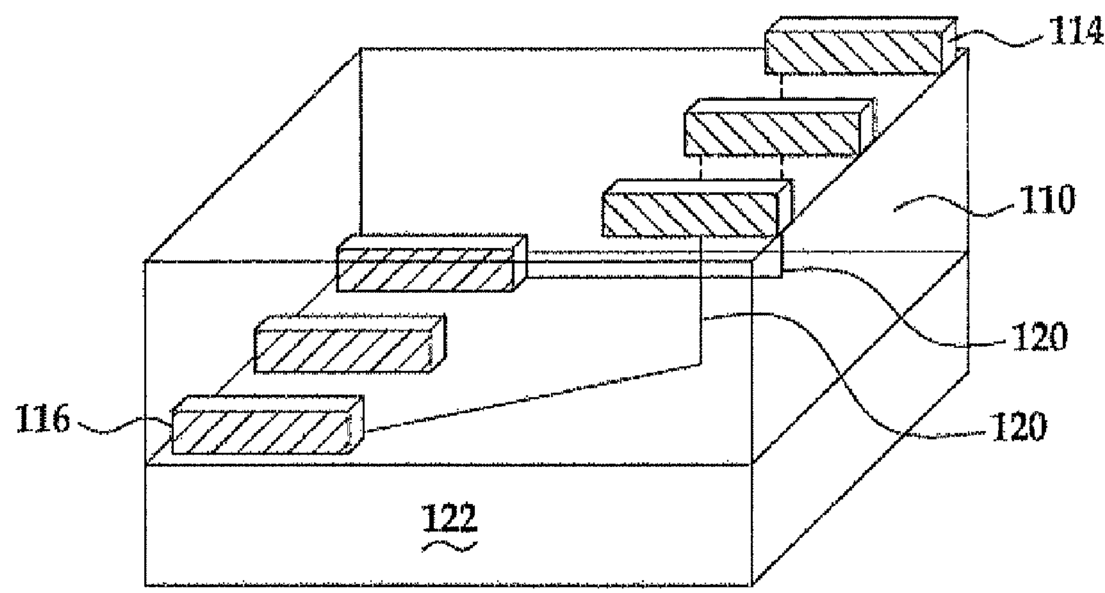

FIGS. 11A and 11B illustrate in three dimensions the chalcogenide phase change device 110 configured to connect the patterned metal depositions 114, 116 within two metal deposition layers. FIG. 11B shows the phase change device 110 after conductive or reflective lines 120 have been drawn both vertically and horizontally within the chalcogenide device 110. The metal deposition layers and phase change device are formed on a substrate 122, such as a silicon wafer, during the back end of line process of semiconductor manufacturing.

In addition to drawing simple lines, it is contemplated that conductive geometric patterns such as spirals can be drawn or erased by the laser between any two metal depositions 114, 116. Further, the device is not limited to two metal deposition layers. More than two layers are contemplated. This process could be enhanced by taking advantage of multi-photon or second order processes. Further, the use of ultrafast lasers is contemplated for such drawing or erasing.

The phase change device 10, 10', 100 is constructed from a chalcogenide phase change material. Chalcogenides are chemical compounds containing an element from Group 16 of the periodic table such as sulfur, selenium, or tellurium and at least one more electropositive element. Examples of chalcogenide materials with phase-change properties include GeSbTe, AgInSbTe, GaSb, InSb, InSbTe, (GeSn)SbTe, InSe, GaSeTe, GeSb(SeTe), SbTe, SnSbTe, TeGeSbS, GeTe, and InSbGe. Chalcogenides are known and have been used, for example, in data storage.

The chalcogenide phase change material may be applied in the back end of line process and may be applied with a laser machine tool by physical vapor deposition. Other non-limiting methods for applying the chalcogenide material include wet chemical methods such as stamping, ink-jetting or spin-coating.

The laser programmable chalcogenide phase change device is manufactured by providing a front end layer containing the active semiconductor elements, such as a fabricated silicon wafer. Each of the front end layer active elements is interconnected with patterned metal lines, wherein at least one inter layer dielectric is deposited on the front end layer and around the metal lines. The phase change device is positioned to contact at least two patterned metal lines, depending on which embodiment of the device is being manufactured. The phase change device may be linearly positioned between a first and second patterned metal line, or may be positioned as an island device. Depending on the position of the phase change device, an adhesive layer may be used. Optionally, the phase change device may contact a plurality of patterned metal depositions within a plurality of metal deposition layers. An over, fuse or outer layer dielectric or dielectric passivation layer may be deposited over top. It is to be understood that a plurality of inter layer dielectrics and metal depositions may be formed on the substrate. Unlike known metal fuses, the phase change, device may be positioned over an active element on the substrate due to the non-destructive use of the device.

By way of example, the substrate 22, 122 used in the front end layer is a wafer typically of polycrystalline silicon. The silicon may be doped with phosphorus, arsenic, boron or gallium, for example. Other materials known in the art may also be used as the substrate. The metal used to form the patterned metal lines and depositions 14, 16 (14', 16', 114, 116) is one of aluminum, copper or tungsten, for example. The metal vias 24 are typically tungsten, but may be other suitable material. The inter layer dielectric 18 is typically silicon dioxide but may be composed of other insulators. Although only one inter layer dielectric is illustrated in the figures, the use of more than one layer is contemplated. The phase change device 10, 10', 110 is a chalcogenide material with a composition as discussed above. Finally, the outer layer dielectric 20 is also typically silicon dioxide, but may be another passivator known in the art. The optional adhesive layer 5 may be chromium, aluminum, titanium, titanium nitride, tungsten, and organic self-assembled monolayers containing amine and carbonyl functional groups, for example.

In general, the thickness of the substrate 22 is greater than 100 μm. An inter layer dielectric 18 will typically range in thickness from 0.2 to 10 μm, while the outer layer dielectric 20 will typically range from 0 to 10 μm. The patterned metal lines 14, 16, shown in FIGS. 1-3 will have a typical thickness of 200 to 1500 nm. The patterned metal lines 14', 16' of FIGS. 4-7 will also have a typical thickness of 200 to 1500 nm. Finally, the phase change device will have a thickness ranging from 100 to 200 nm. These thicknesses are illustrative and are not meant to be limiting.

A method of activating the laser chalcogenide phase change device is also disclosed. The method provides non-destructive processing, allowing the space on a semiconductor substrate or wafer to be used as efficiently as possible.

One embodiment of the method of activating the laser chalcogenide phase change device comprises selecting a laser condition based on at least one characteristic of the chalcogenide device and programming a phase-change within the device with the laser by direct photon absorption until a threshold transition temperature is met. The embodiment is described in detail below.

The method first involves the selection of a "laser condition." The "laser condition" as used herein is defined as one or more laser pulses with a specific laser wavelength, pulse energy, spot size, position of focus offset, pulse width, pulse rise time, temporal pulse shape and spatial pulse shape. In selecting the proper laser condition for processing the phase change device, one or more of these parameters may vary or be optimized depending on the chalcogenide material used and its characteristics, the design of the device, the structure in which it is used, and the desired result. For example, the optical absorbance characteristic of the device may vary depending on the chalcogenide material used. Other characteristics of the device may depend on, for example, the depth of the outer layer dielectric and the thickness of the phase change device itself. A non-limiting example of the laser used in the activation method has a non-flat spatial profile, for example a Gaussian or Lorentzian shape, to take advantage of the hot center portion of the laser spot size.

The selection of the laser condition depends in part on the ability of the phase change material to absorb laser energy and heat. This characteristic, the ability to absorb laser energy, can be described in part by the temperature-dependent absorption coefficient of the chalcogenide material. Other considerations include the additional "nonlinear" heating effects that can occur between lasers and materials such as multi-photon interactions, as well as effects due to device material layers and compositions that can increase or decrease the efficiency of absorption. The absorption coefficient "k", as used herein, is defined as the imaginary part of the complex refractive index.

The selection of the laser condition also depends on the desired phase-change result. Depending on the laser condition selected, the amorphous and crystalline phases of the chalcogenide materials can have different "k" values. In order to achieve consistent results at a given laser condition, it would be convenient, though not necessary, to select a laser wavelength that has similar "k" values for both the amorphous and crystalline state of the chalcogenide material to be activated. For example, the literature reports that for $Ge_2Sb_2Te_5$ at room temperature, the "k" values for the amorphous and crystalline states start to converge at a wavelength below about 650 nm and start to overlap in the region between about 355 to about 266 nm. (Proceedings of the Data Storage Topical Meeting, ODS Conference Digest, April 1997, pp. 104; Mat. Res. Soc. Symp. Proc., vol. 674, 2001, pp. v1.1). Specifically, in the region of 355-266 nm, the "k" values for both crystalline and amorphous states of the $Ge_2Sb_2Te_5$ material are in the region of about 2.0-2.5. Therefore, if the desired result was for a reversible laser fuse, reversing between a crystalline state and an amorphous state and vice versa, it would be desirable to use a laser wavelength in the region between 200 nm to 650 nm so that approximately the same laser condition can be used to convert to either the crystalline or amorphous phase. This would eliminate the need to change the laser condition based on the phase of a particular chalcogenide phase change device after the condition has been selected.

The desired phase-change of the chalcogenide device is programmed with a laser operated under the selected laser condition by direct photon absorption until a threshold transition temperature is met. This transition temperature is dependent upon the chalcogenide material used and the desired resulting phase. Programming of the chalcogenide fuse device occurs by controlling the laser condition selected. Lower energy laser pulses with wider pulse widths can be used to crystallize the chalcogenide materials by slowly heating the material above the crystalline phase transition temperature but below the material's melting point. Higher energy pulses and shorter pulse widths can be used to heat up the material to around its melting point to cause the conductive crystalline state to "randomize" into the non-conductive amorphous state. A third phase-change result is also possible. Chalcogenide phase change devices also can also be activated to a state of "permanently non-conductive". The permanently non-conductive state is the result of vaporizing or ablating the chalcogenide fuse in a similar fashion to the way metal fuses are currently processed.

In practice, depending on whether a fuse, for example, is being activated or deactivated, a laser condition must be selected to heat the chalcogenide material to a temperature where the material begins to crystallize, or to a temperature where the crystalline structure is melted. Again using $Ge_2Sb_2Te_5$ as an example, the crystallization phase transition temperature begins at about 150 to about 170° C. and the melting point is about 640° C. (Mat. Res. Soc. Symp. Proc., vol. 918, 2006, pp. 0918-H08-04; Mat. Res. Soc. Symp. Proc., vol. 803, 2004, pp. HH2.1.1). For example, heating an amorphous $Ge_2Sb_2Te_5$ material above 150-170° C. results in several orders of magnitude change in the conductivity of the material, from $10^{-3}$ ohm$^{-1}$ cm$^{-1}$ to $10^{3}$ ohm$^{-1}$ cm$^{-1}$. (Mat. Res. Soc. Symp. Proc., vol. 803, 2004, pp. HH2.1.1).

Another embodiment of the method detailed above for a phase change device used in a semiconductor involves an additional step prior to or just subsequent to the selection of the proper wavelength. This step involves the identification of one or more phase change devices requiring activation or deactivation within the semiconductor. The identification may be done, for example, by a tester that determines defective chips on a wafer and sending that information to a laser repair system. The laser condition of the laser would again be selected based on the properties of the phase change device as disclosed above, either before or after the identification step. The laser would heat the device as above, programming a phase-change of the phase change device with the laser by direct photon absorption until the desired resulting phase-change occurs.

Laser chalcogenide phase change fuses have implications that allow these fuses to be placed into a smaller area on a computer chip compared with traditional metal fuses. Metal laser fuses must be placed far enough apart so that no part of the laser beam spot can overlap onto an adjacent fuse during processing. Even a small amount of overlapping or stray energy will heat up an adjacent metal fuse and the resulting thermal expansion will crack the surrounding dielectric material. These resulting cracks weaken the fuse structure, and it may render the fuse impossible to process. However, chalcogenide fuses have a lower coefficient of thermal expansion compared to metal fuses. For example, $Ge_2Sb_2Te_5$ has a coefficient of thermal expansion of 2 to $7\times10^{-6}$/° C. compared to $23\times10^{-6}$/° C. for Aluminum, typically used in metal fuses. This suggests that a laser chalcogenide phase-change fuse could receive some amount of heating from stray laser energy without concern for damage or cracking of the surrounding dielectric. Therefore, chalcogenide laser fuses could be placed closer together than one-half the width of the laser spot size. Processing a laser chalcogenide fuse would result in a small but non-affective amount of laser energy to the adjacent neighbor fuse(s). The chalcogenide fuse being processed would receive the hottest part of the laser spot size and would be activated or deactivated as required; the adjacent fuse(s) would receive some energy during the process but not enough to program a change or damage in these fuses. Finally, the UV region of 266 to 355 nm offers the additional advantage of significantly smaller diffraction-limited spot sizes allowing the chalcogenide fuses to be constructed to the smallest possible dimensions.

The embodiments of the method of activation may be used for fine-tuning or trim, wherein the activation of the phase change device allows adjustment of some electrical property of the semiconductor device, such as adjustment of chip voltages. The embodiments may also be utilized for redundancy repair application, wherein the activation process is used to replace faulty semiconductor device elements with functional substitutes. This programming application removes the defective element by encoding its address into the decoder of a redundant element. Other uses for laser activation of the laser phase change chalcogenide devices are contemplated.

Because destruction of the device and damage to the surrounds does not occur, both active and inactive elements can be placed directly below the laser phase change device.

Allowing placement of laser phase change devices over both active and inactive elements of circuitry also reduces the required space. Further, reversible processing of the laser phase change chalcogenide devices is possible with die disclosed activation method, as well as real-time process feedback of fuse states.

While the invention has been described in connection with certain embodiments, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. A laser activated phase change device for use in a semiconductor integrated circuit, the device comprising:

a fuse made of a phase change material and connected between a first metal line and a second metal line, each metal line lying either on or within an inter layer dielectric such that bottom surfaces of the first and second metal lines lie at substantially a same height with respect to a substrate, the fuse having a bottom surface and an opposing top surface and positioned such that at least a portion of the bottom surface is in contact with the inter layer dielectric either directly or through only an adhesive layer at substantially the same height as or at a height higher than the bottom surfaces of the first and second metal lines and such that an over fuse dielectric overlies at least a portion of the top surface, the over fuse dielectric having a thickness such that the over fuse dielectric is transmissive to wavelengths generated by a laser sufficient to program a phase change of the fuse using direct photon absorption and wherein the fuse interconnects active semiconductor elements manufactured on the substrate.

2. The device of claim 1, wherein the fuse is configured to completely fill a gap between the first and second metal lines.

3. The device of claim 1, wherein ends of the first and second metal lines form a gap therebetween and the fuse is layered on respective portions of the ends of the first and second metal lines to span the gap.

4. The device of claim 3 further comprising:

an adhesive layer between the fuse and the respective portions of the ends of the first and second metal lines.

5. The device of claim 3, wherein the fuse fills at least a portion of the gap in addition to spanning the gap.

6. The device of claim 1, wherein the first and second metal lines are located within the inter layer dielectric, the device further comprising:

a first interconnect via vertically extending from the first metal line in a direction away from the substrate; and a second interconnect via vertically extending from the second metal line in the direction away from the substrate, the fuse connected between the first and second metal lines by spanning a gap between the first and second interconnect vias.

7. The device of claim 1, further comprising:

a laser fuse bank comprising a plurality of fuses, the fuse being one of the plurality of fuses and the fuse spaced from adjacent fuses by a distance of less than one-half a width of a spot size of the laser.

8. The device of claim 7 wherein each of the plurality of fuses is made of the phase change material and is connected between a respective first metal line and a respective second metal line, each metal line lying either on or within the inter layer dielectric such that bottom surfaces of the metal lines lie at substantially the same height with respect to the substrate, each fuse having a respective bottom surface and a respective opposing top surface and positioned such that at least a portion of each bottom surface is in contact with the inter layer dielectric either directly or through only a respective adhesive layer at substantially the same height as or at a height higher than the bottom surfaces of the metal lines and such that the over fuse dielectric overlies at least portions of each top surface and wherein each fuse of the plurality of fuses interconnects active semiconductor elements manufactured on the substrate.

9. The device of claim 1 wherein the fuse reversably electrically interconnects the active semiconductor elements manufactured on the substrate.

10. The device of claim 1 wherein the over fuse dielectric is silicon dioxide; and wherein the thickness of the over fuse dielectric overlying the top surface of the fuse is less than approximately 10 micrometers.

11. The device of claim 1 wherein the active semiconductor elements manufactured on the substrate comprise a first active semiconductor element and a second active semiconductor element, the first active semiconductor element connected to the fuse through the first metal line and the second active semiconductor element connected to the fuse through the second metal line.

* * * * *